United States Patent
Jang et al.

(10) Patent No.: US 10,056,339 B2
(45) Date of Patent: Aug. 21, 2018

(54) SEMICONDUCTOR DEVICES

(71) Applicant: SAMSUNG ELECTRONICS CO., LTD., Suwon-si, Gyeonggi-Do (KR)

(72) Inventors: Hyeon-Woo Jang, Suwon-si (KR); Junghwan Park, Seoul (KR); Ramakanth Kappaganthu, Suwon-si (KR); Sungjin Kim, Seoul (KR); Junyong Noh, Yongin-si (KR); Jung-Hoon Han, Hwaseong-si (KR); Seung Soo Kim, Seoul (KR); Sungjin Kim, Hwaseong-si (KR); Sojung Lee, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/628,349

(22) Filed: Jun. 20, 2017

(65) Prior Publication Data

US 2018/0040571 A1    Feb. 8, 2018

(30) Foreign Application Priority Data

Aug. 5, 2016 (KR) .......................... 10-2016-0100030

(51) Int. Cl.
| | |
|---|---|
| *H01L 23/48* | (2006.01) |
| *H01L 23/52* | (2006.01) |
| *H01L 29/40* | (2006.01) |
| *H01L 23/00* | (2006.01) |
| *H01L 23/58* | (2006.01) |

(52) U.S. Cl.
CPC .......... *H01L 23/562* (2013.01); *H01L 23/585* (2013.01); *H01L 2924/3512* (2013.01)

(58) Field of Classification Search
CPC . H01L 2224/26175; H01L 2224/26145; H01L 23/49827; H01L 24/09; H01L 2224/0401
USPC ................................ 257/750, 758, 797, 798
See application file for complete search history.

(56) References Cited

U.S. PATENT DOCUMENTS

| | | | |
|---|---|---|---|
| 5,003,374 A | 3/1991 | Vokoun, III | |
| 6,400,174 B2 * | 6/2002 | Akram | ................ G01R 1/0483 324/750.25 |
| 6,841,880 B2 | 1/2005 | Matsumoto | |
| 6,984,895 B2 | 1/2006 | Cho et al. | |
| 7,091,621 B1 | 8/2006 | Eppes | |
| 7,354,790 B2 | 4/2008 | Rajagopalan et al. | |

(Continued)

FOREIGN PATENT DOCUMENTS

| | | |
|---|---|---|
| JP | 2012-089668 A | 5/2012 |
| JP | 2015-092607 A | 5/2015 |

(Continued)

*Primary Examiner* — Sheila V. Clark
(74) *Attorney, Agent, or Firm* — Volentine, Whitt & Francos, PLLC

(57) ABSTRACT

A semiconductor device includes a substrate, a first insulation layer, data storage elements, a contact plug, and a first dummy dam. The first insulation layer is on the substrate and includes a pad region and a peripheral region adjacent to the pad region. The data storage elements are on the pad region of the first insulation layer. The contact plug penetrates the first insulation layer on the peripheral region. The first dummy dam penetrates the first insulation layer and is disposed between the data storage elements and the contact plug.

20 Claims, 17 Drawing Sheets

(56) References Cited

U.S. PATENT DOCUMENTS

| | | |
|---|---|---|
| 7,960,814 B2 | 6/2011 | Vo |
| 7,994,613 B2 | 8/2011 | Jung |
| 8,278,737 B2 | 10/2012 | Chen et al. |
| 8,502,324 B2 | 8/2013 | Poi et al. |
| 8,623,743 B2 | 1/2014 | Lee et al. |
| 8,866,260 B2 | 10/2014 | Shieh et al. |
| 8,912,076 B2 | 12/2014 | West et al. |
| 9,048,019 B2 | 6/2015 | Kerber et al. |
| 9,093,093 B2 * | 7/2015 | Nagarajan ............ G11B 5/5521 |
| 9,093,393 B2 * | 7/2015 | Suda ................... H01L 23/3157 |
| 9,245,802 B2 | 1/2016 | Lei et al. |
| 9,257,398 B2 | 2/2016 | Kim |
| 9,287,221 B2 * | 3/2016 | Huang ................ H01L 23/3178 |
| 9,460,978 B1 * | 10/2016 | Or-Bach ........... H01L 23/49827 |
| 2010/0314674 A1 | 12/2010 | Etou |
| 2014/0332872 A1 | 11/2014 | Kim |
| 2015/0021733 A1 | 1/2015 | Nakamura et al. |
| 2015/0108605 A1 | 8/2015 | Park et al. |
| 2017/0170247 A1 * | 6/2017 | Kim .................... H01L 27/3213 |

FOREIGN PATENT DOCUMENTS

| | | |
|---|---|---|
| KR | 10-2002-0002703 A | 1/2002 |
| KR | 10-2009-0109707 A | 10/2009 |
| KR | 10-2011-0077432 A | 7/2011 |
| KR | 10-2012-0067678 A | 6/2012 |

* cited by examiner

SEMICONDUCTOR DEVICES

CROSS-REFERENCE TO RELATED APPLICATIONS

This U.S. nonprovisional patent application claims priority under 35 U.S.C. § 119 to Korean Patent Application 10-2016-0100030, filed on Aug. 5, 2016 in the Korean Intellectual Properly Office, the entire contents of which are hereby incorporated by reference.

BACKGROUND

1. Technical Field

The present disclosure relates to a semiconductor device. More particularly, the present disclosure relates to a semiconductor device that includes a structure or structures for reducing or eliminating the effects of impact and/or stress.

2. Background Information

Semiconductor devices are an important factor in the electronic industry because of their small size, diverse functionality, and/or low fabrication cost. The semiconductor devices are being increasingly integrated with the remarkable development of the electronic industry. With the recent trend of increasing integration of semiconductor devices, it is increasingly important to prevent semiconductor devices from breakage caused by external mechanical stress. During the fabrication of semiconductor devices, the semiconductor devices may suffer from stress caused by contact or impact. If the semiconductor devices are severely stressed, the semiconductor devices may be troubled with cracks and eventually fail.

SUMMARY

Embodiments of the present disclosure provide a semiconductor device that is tough against external mechanical stress.

An object of the present disclosure is not limited to reducing or eliminating effects of impact and/or stress; rather, other objects and results will be clearly understood to those skilled in the art from the following description.

According to exemplary embodiments of the present disclosure, a semiconductor device may include a substrate, a first insulation layer, data storage elements, a contact plug, and a first dummy dam. The first insulation layer may be disposed on the substrate and may include a pad region and a peripheral region adjacent to the pad region. The data storage elements may be provided in the pad region of the first insulation layer. The contact plug may penetrate the first insulation layer on the peripheral region. The first dummy dam may penetrate the first insulation layer and may be disposed between the data storage elements and the contact plug.

According to exemplary embodiments of the present disclosure, a semiconductor device may include a substrate, a first insulation layer, a second insulation layer, and a metal layer. The first insulation layer may be on the substrate and may include a pad region, a scribe region, and a buffer region between the pad region and the scribe region. The second insulation layer may be on the first insulation layer. The metal layer may be on the second insulation layer on the buffer region. The metal layer may include at least one trench.

According to exemplary embodiments of the present disclosure, a semiconductor device may include a substrate, a first insulation, a plurality of data storage elements, a contact plug, and a first dummy dam. The first insulation layer may be on the substrate and may include a pad region interior to a peripheral region. The plurality of data storage elements may be at least partly in the pad region of the first insulation layer. The contact plug may be at least partly in the first insulation layer in the peripheral region. The first dummy dam may be at least partly in the first insulation layer and disposed substantially around the data storage elements so as to form a perimeter around the data storage elements to absorb energy from external impacts to a side of the semiconductor device.

DETAILED DESCRIPTION OF EMBODIMENTS

It will be herein described about a semiconductor device according to the present disclosure with reference to accompanying drawings.

Figure 1:
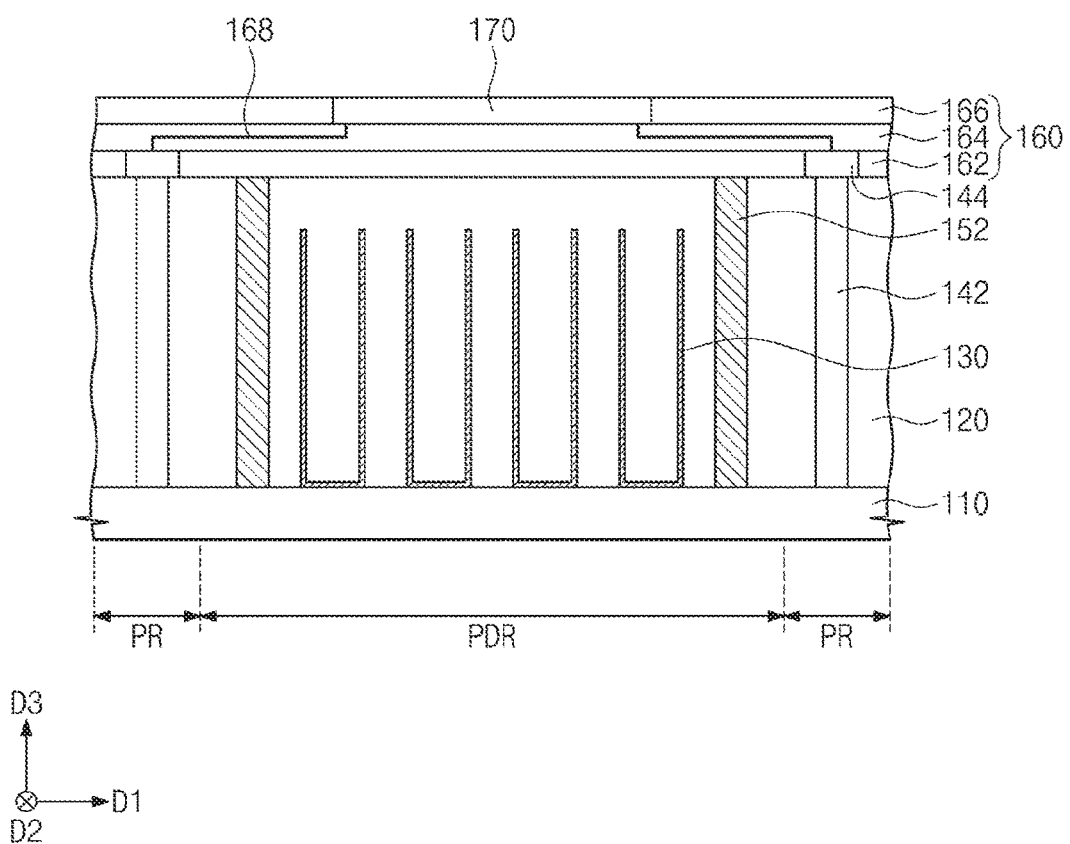
FIG. 1 is a cross-sectional view of a semiconductor device according to exemplary embodiments of the present disclosure.
Figure 2:
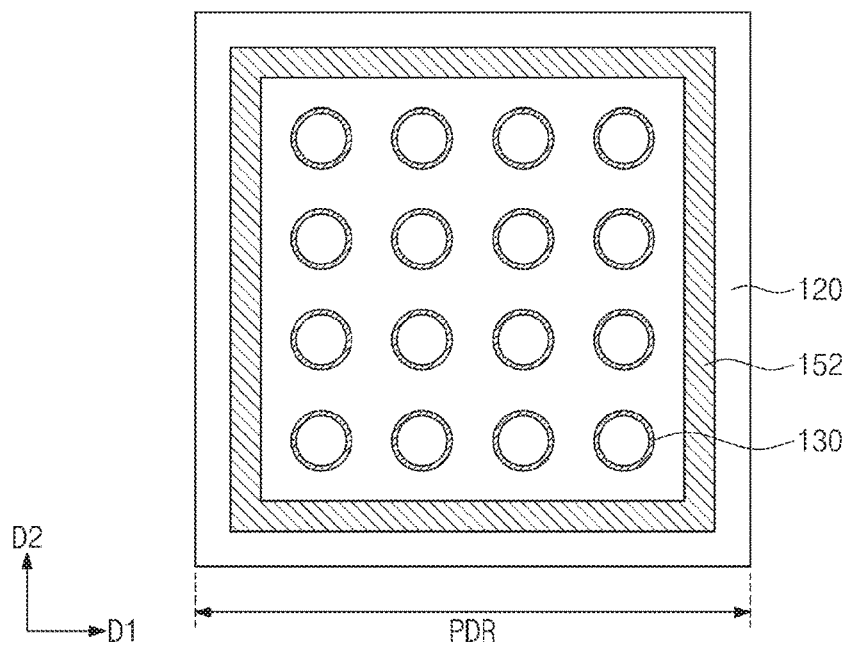
FIGS. 2 to 4 are plan views for explaining a first dummy dam shown in FIG. 1.
Figure 3:
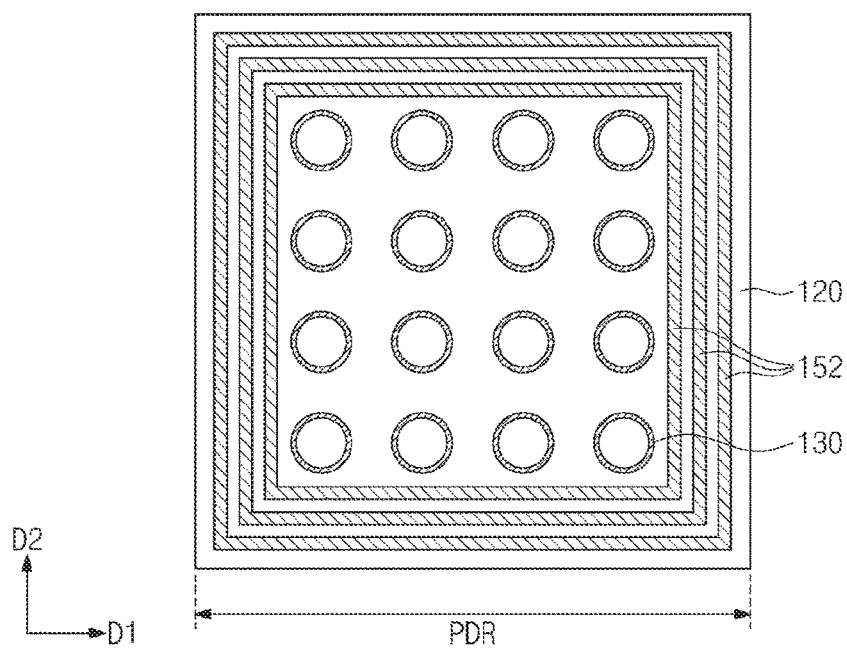
Figure 4:
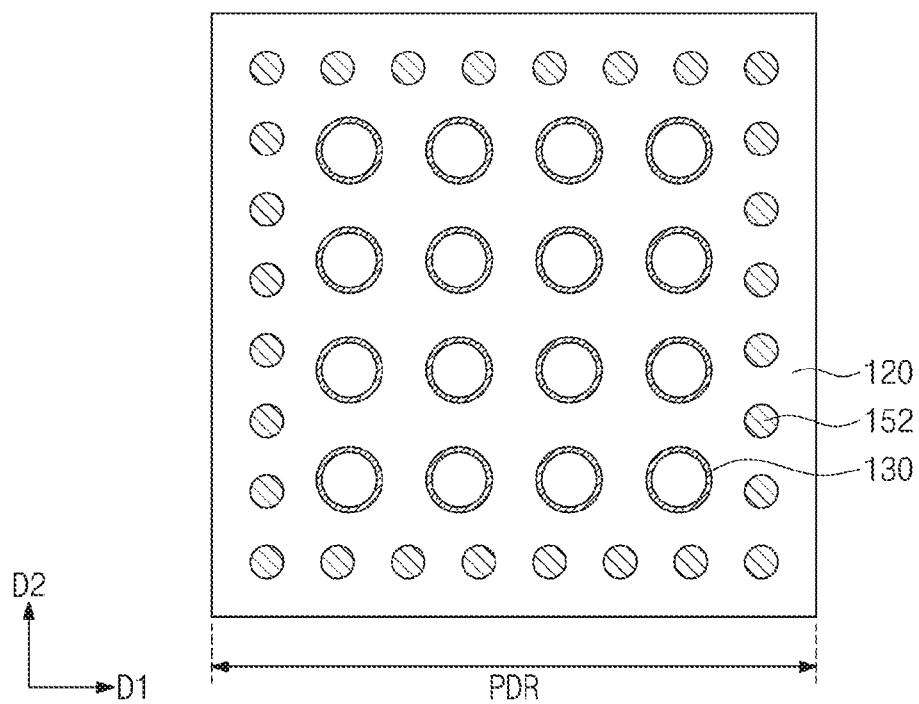
Figure 5:
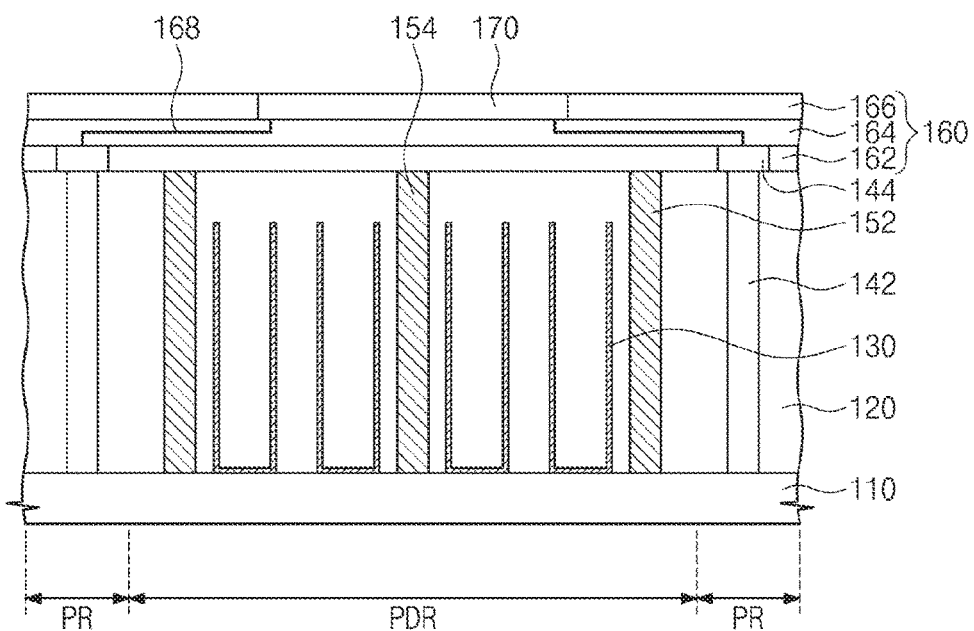
FIG. 5 is a cross-sectional view for explaining a semiconductor device according to exemplary embodiments of the present disclosure.
Figure 5:
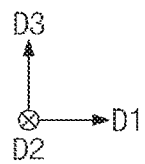
Figure 6:
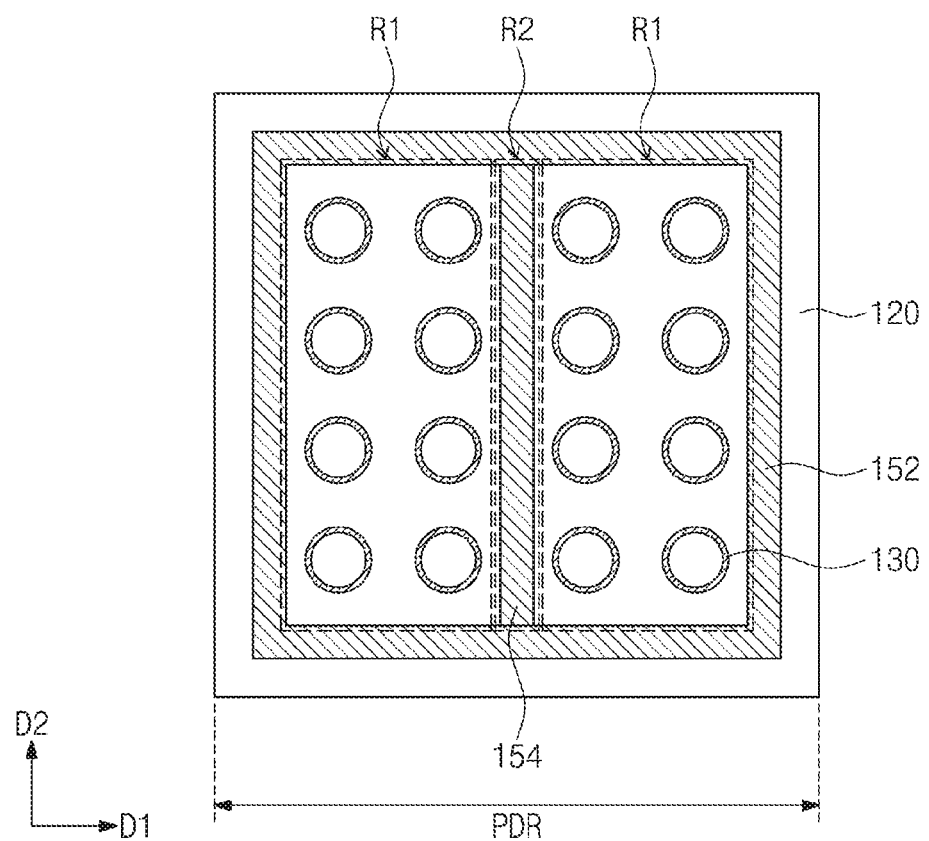
FIGS. 6 to 8 are plan views for explaining a second dummy dam shown in FIG. 5.
Figure 7:
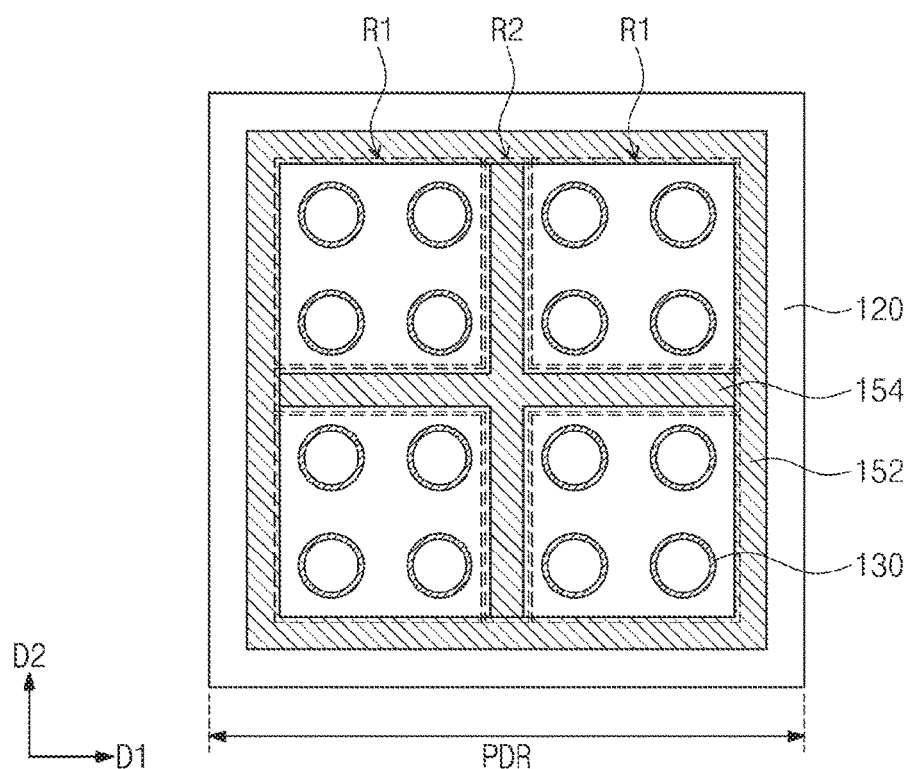
Figure 8:
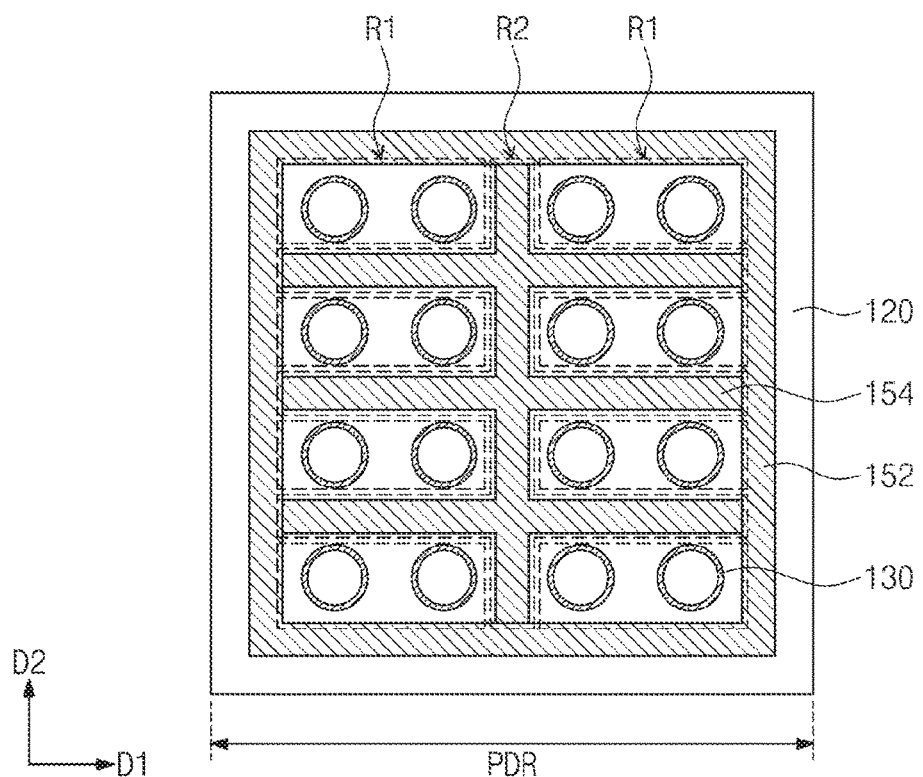

FIG. 1 is a cross-sectional view for explaining a semiconductor device according to exemplary embodiments of the present disclosure. FIGS. 2 to 4 are plan views for explaining a first dummy dam shown in FIG. 1. FIG. 5 is a cross-sectional view for explaining a semiconductor device according to exemplary embodiments of the present disclosure. FIGS. 6 to 8 are plan views for explaining a second dummy dam shown in FIG. 5.

Referring to FIG. 1, a substrate 110 may be provided. For example, the substrate 110 may be a semiconductor wafer including at least one of silicon (Si), germanium (Ge), and compound semiconductor. The present disclosure is, however, not limited thereto.

Although not shown in figures, a circuit layer (not shown) may be formed on the substrate 110. For example, the circuit layer (not shown) may include an integrated circuit and a single- or multi-layered metal line electrically connected to the integrated circuit. The integrated circuit may include a dynamic random access memory (DRAM).

A first insulation layer 120 may be provided on the substrate 110. For example, the substrate 110 may be provided thereon with the first insulation layer 120 to cover the circuit layer (not shown). The first insulation layer 120 may include a peripheral region PR and a pad region PDR. The peripheral region PR may be disposed adjacent to the pad region PDR in a first direction D1. In this description, the first direction D1 may be parallel to a top surface of the substrate 110, and a second direction D2 may be parallel to the top surface of the substrate 110 and perpendicular to the first direction D1. A third direction D3 may be perpendicular to the top surface of the substrate 110.

Data storage elements 130 may be disposed in the first insulation layer 120. In detail, the data storage elements 130 may be disposed in the pad region PDR of the first insulation layer 120 and covered with the first insulation layer 120. The data storage elements 130 may be accomplished in diverse shapes. In some embodiments, the data storage elements 130 may be multiple capacitors.

A contact plug 142 may be disposed in the first insulation layer 120. In detail, the contact plug 142 may be disposed in the peripheral region PR of the first insulation layer 120, and may penetrate the first insulation layer 120 in the third direction D3. The contact plug 142 may include tungsten (W).

A first dummy dam 152 may be disposed in the first insulation layer 120. In detail, the first dummy dam 152 may be disposed between the data storage elements 130 and the contact plug 142. The first dummy dam 152 may be disposed in the pad region PDR of the first insulation layer 120, and may penetrate the first insulation layer 120 in the third direction D3. The first dummy dam 152 may be spaced apart from the contact plug 142. The first dummy dam 152 may be insulated from the contact plug 142. The first dummy dam 152 may be electrically separated from the circuit layer (not shown). The first dummy dam 152 may include the same material as the contact plug 142. The first dummy dam 152 may include tungsten (W). For example, the first dummy dam 152 may be formed simultaneously with the contact plug 142 in a process for fabricating a semiconductor device.

In some embodiments, as viewed in plan, the first dummy dam 152 may surround the data storage elements 130. As shown in FIG. 2, the first dummy dam 152 may have a planar ring rectangular shape (e.g., a planar rectangular ring shape) surrounding the data storage elements 130. As shown in FIG. 3, the first dummy dam 152 may include multiple separate components. For example, as viewed in plan, the first dummy dams 152 may be combined to form a broken wall of multiple wall components surrounding the data storage elements 130. In this case, each of the first dummy dams 152 may have a planar ring shape. Alternatively, as shown in FIG. 4, each of the first dummy dams 152 may have a pillar shape. In this case, as viewed in plan, the first dummy dams 152 may be disposed to surround the data storage elements 130.

The first dummy dam 152 may be provided to protect the data storage elements 130 from external stress. The first dummy dam 152 may be tough against mechanical stress. The word "tough" as used herein may be taken to reflect an ability to absorb impact and/or stress without passing the impact or stress through to another element. Of course, the ability to absorb impact and/or stress is relative. For the purposes of the present disclosure, the protection offered by the first dummy dam 152 or other protective elements protects data storage elements 130 to at least some degree from stress and/or impact that would otherwise be conveyed to the data storage elements 130. That is, the reduction in stress and/or impact may be by the first dummy dam 152 or other protective element absorbing energy conveyed by stress and/or impact. For example, when the semiconductor device is subject to impact and/or stress that would impact or stress the data storage elements 130, the first dummy dam 152 may serve as a partition wall that relieves the stress or impact such that the data storage elements 130 may be protected from the stress or impact. Furthermore, as shown in FIG. 3, when the first dummy dams 152 are formed as a broken wall of multiple wall components, the first dummy dams 152 may be more resistant to stress applied in a direction principally parallel to the top surface of the substrate 110.

Referring to FIGS. 5 and 6, a second dummy dam 154 may be provided. The second dummy dam 154 may also be disposed in the first insulation layer 120. In detail, the second dummy dam 154 may also be disposed in the pad region PDR of the first insulation layer 120, and may also penetrate the first insulation layer 120 in the third direction D3. The second dummy dam 154 may include the same material as the contact plug 142. The second dummy dam 154 may include tungsten (W). For example, the second dummy dam 154 may be formed simultaneously with the contact plug 142 and the first dummy dam 152 in a process for fabricating a semiconductor device.

The second dummy dam 154 may be disposed between the data storage elements 130. For example, as shown in FIG. 6 the pad region PDR of the first insulation layer 120 may include first portions R1 spaced apart from each other and a second portion R2 between the first portions R1. The data storage elements 130 may be disposed in the first portions R1 of the first insulation layer 120. The second dummy dam 154 may be disposed in the second portion R2 of the first insulation layer 120. The second portion R2 may have diverse shapes. The second dummy dam 154 may have the same planar shape as the second portion R2. For example, as shown in FIG. 6, the second dummy dam 154 may run across the pad region PDR along the second direction D2. Alternatively, as shown in FIG. 7, the second dummy dam 154 may divide the pad region PDR into four segments along the first and second directions D1 and D2. Dissimilarly, as shown in FIG. 8, the second dummy dam 154 may divide the pad region PDR into eight segments along the first and second directions D1 and D2. In these cases, as viewed in plan, the second dummy dam 154 may be in contact with an inner side of the first dummy dam 152. The present disclosure is, however, not limited thereto. The second dummy dam 154 may have various planar shapes. Although not shown in figures, the second dummy dam 154 may include multiple separate components. For example, the second dummy dam 154 may be provided as a broken wall of multiple wall components disposed in the portion R2.

Referring back to FIG. 5, the second dummy dam 154 may also be provided to protect the data storage elements 130 from stress. The second dummy dam 154 may be tough against stress. As noted previously, the word "tough" as used herein means that the protection offered by the second dummy dam 154 protects data storage elements 130 from stress and/or impact that would otherwise be conveyed to the data storage elements 130. For example, when the semiconductor device is subject to impact and/or stress that would impact or stress the data storage elements 130, the second dummy dam 154 may serve as a partition wall that relieves the stress or impact such that the data storage elements 130 may be protected from the stress or impact. Moreover, as discussed above, when the second dummy dam 154 is formed to have a shape of a broken wall of multiple wall components, the data storage elements 130 may be more effectively protected from stress.

Referring back to FIG. 1, a second insulation layer 160 may be disposed on the first insulation layer 120. The second insulation layer 160 may cover top surfaces of the first insulation layer 120 and the first dummy dam 152. The second insulation layer 160 may be formed to have a structure of multiple levels. The second insulation layer 160 may include a first layer 162, a second layer 164, and a third layer 166 that are sequentially stacked. The present disclosure is, however, not limited thereto. The second insulation layer 160 may be formed to have a structure of a single level, as needed.

A contact pad 144 may be disposed in the second insulation layer 160 on the peripheral region PR. In detail, the contact pad 144 may be disposed in the first layer 162 of the second insulation layer 160, and may be coupled to the contact plug 142. The contact pad 144 may be electrically connected to the contact plug 142. The contact pad 144 may be covered with the second layer 164 of the second insulation layer 160.

An electrode pad 170 may be disposed in the second insulation layer 160. In detail, the electrode pad 170 may be disposed in the third layer 166 of the second insulation layer 160. The electrode pad 170 may be disposed on the pad region PDR, and in this case the electrode pad 170 may overlap the data storage elements 130, as viewed in plan. The electrode pad 170 may have a top surface that is exposed through the second layer 164 of the second insulation layer 160. The electrode pad 170 may be electrically connected to the contact pad 144 through an interconnect line 168 disposed in the second layer 164 of the second insulation layer 160. The electrode pad 170 may be insulated from the first and second dummy dams 152 and 154. The top surface of the electrode pad 170 may receive a probe for testing whether or not a semiconductor device satisfies predetermined parameters, or may permit an external interconnect terminal (e.g., a solder ball or bump) to be connected thereto.

Figure 9:
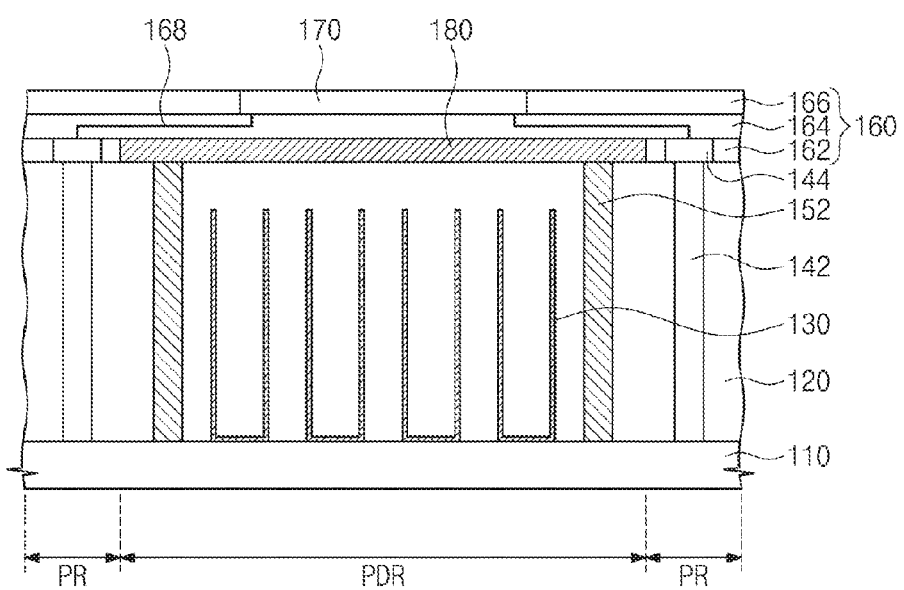
FIG. 9 is a cross-sectional view for explaining a semiconductor device according to exemplary embodiments of the present disclosure.
Figure 9:
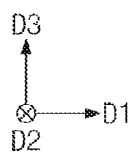
Figure 10:
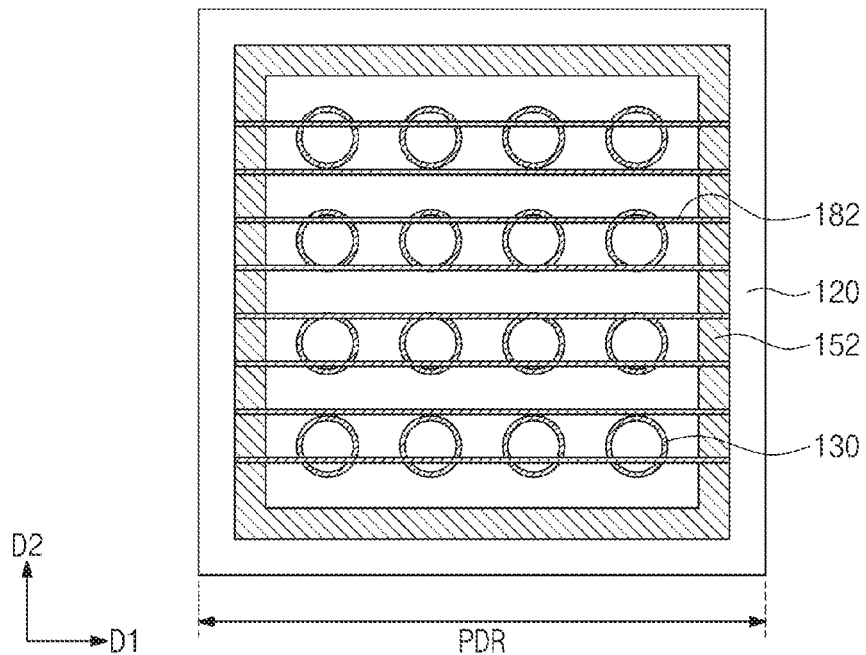
FIGS. 10 and 11 are plan views for explaining a metal layer shown in FIG. 9.
Figure 11:
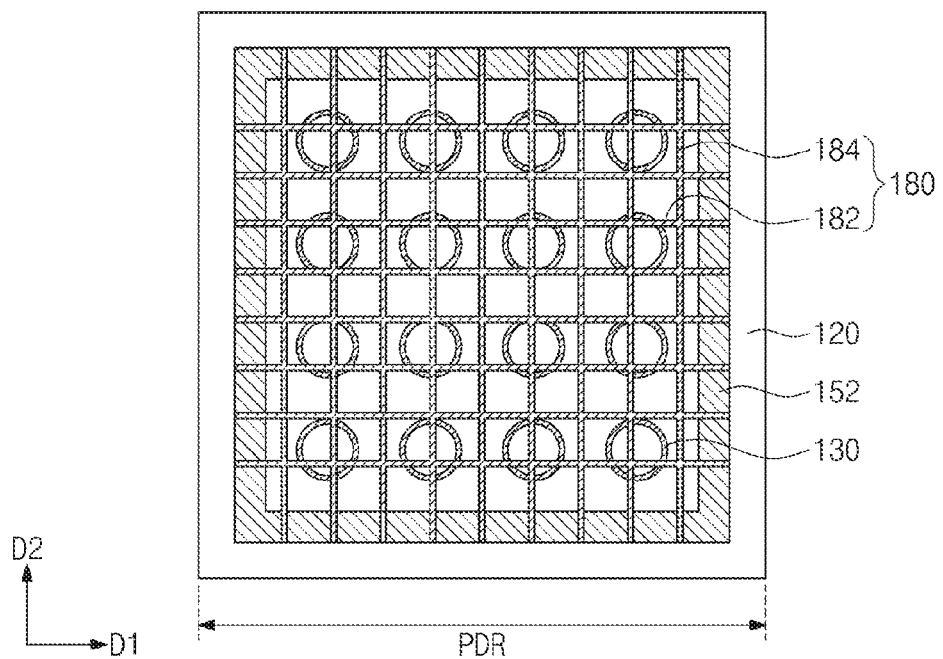

FIG. 9 is a cross-sectional view for explaining a semiconductor device according to exemplary embodiments of the present disclosure. FIGS. 10 and 11 are plan views for explaining a metal layer shown in FIG. 9. For convenience of the description, components discussed above are allocated the same reference numerals thereto, and a repetitive explanation is omitted.

A protection layer 180 may be further included in a semiconductor device according to exemplary embodiments of the present disclosure. The protection layer 180 may protect the data storage elements 130.

Referring to FIG. 9, the protection layer 180 may be disposed on the first insulation layer 120. In detail, the protection layer 180 may be disposed on the pad region PDR of the first insulation layer 120, and may be in contact with the first dummy dam 152. In other words, the first dummy dam 152 may support the protection layer 180. The protection layer 180 may be provided in the first layer 162 of the second insulation layer 160. As viewed in plan, the protection layer 180 may overlap the data storage elements 130. The protection layer 180 may be positioned at the same level of the contact pad 144.

The protection layer 180 may have a planar line or mesh shape. For example, as shown in FIG. 10, the protection layer 180 may include multiple metal lines 182 extending in the first direction D1. Alternatively, as shown in FIG. 11, the protection layer 180 may include first metal lines 182 and second metal lines 184 crossing each other. The present disclosure is, however, not limited thereto. The protection layer 180 may have diverse shapes such as a plate shape or a honeycomb shape.

The protection layer 180 may include a metal. The protection layer 180 may include the same material as the contact pad 144. The protection layer 180 may include tungsten (W). For example, the protection layer 180 may be formed simultaneously with the contact pad 144 in a process for fabricating a semiconductor device.

The protection layer 180 may be provided to protect the data storage elements 130 from stress. In detail, the protection layer 180 may be supported by the first dummy dam 152. The protection layer 180 may thus be tough against impact or stress applied chiefly from above. As noted previously, the word "tough" as used herein means that the protection offered by the protection layer 180 protects data storage elements 130 from stress and/or impact that would otherwise be conveyed to the data storage elements 130. For example, when the data storage elements 130 are under impact or stress from above, the protection layer 180 may serve as a partition wall that relieves the impact or stress. As such, the impact or stress may pass through the protection layer 180 and may then be dispersed into the first dummy dam 152. The protection layer 180 may therefore protect the data storage elements 130 from the impact or stress. As shown in FIGS. 6 to 8, when the second dummy dam 154 is further provided, the protection layer 180 may be supported by the second dummy dam 154 as well as the first dummy dam 152. Therefore, the protection layer 180 may be more resistant to the impact or stress applied from above.

Figure 12A:
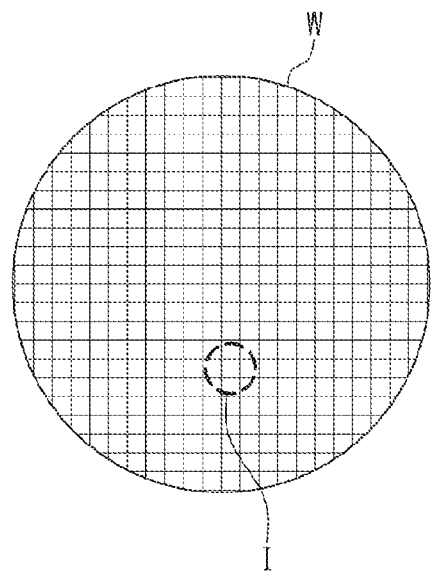
FIG. 12A is a cross-sectional view for explaining a semiconductor device according to exemplary embodiments of the present disclosure.
Figure 12B:
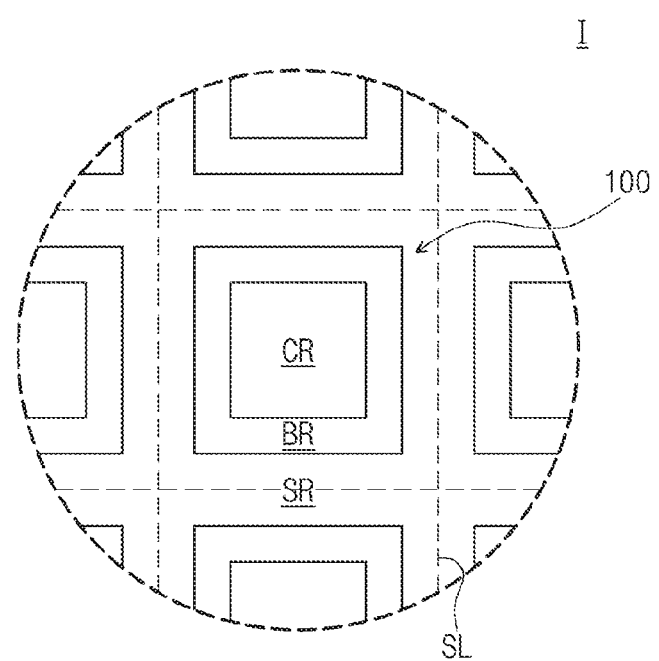
FIG. 12B is a plan view showing enlarged section I shown in FIG. 12A.

FIG. 12A is a cross-sectional view for explaining a semiconductor device according to exemplary embodiments of the present disclosure. FIG. 12B is a plan view showing enlarged section I shown in FIG. 12A. FIG. 12B roughly shows a portion of a wafer W. For convenience of the description, components discussed above are allocated the same reference numerals thereto, and a repetitive explanation is omitted.

Referring to FIGS. 12A and 12B, semiconductor devices 100 may be formed on the wafer W. Each of the semiconductor devices 100 may include chips disposed on its cell regions CR. Each of the semiconductor devices 100 may include a buffer region BR and a portion of a scribe region SR. As viewed in plan, the scribe region SR may have a linear shape passing between the cell regions CR, and the buffer region BR may be disposed between the cell region CR and the scribe region SR while surrounding the cell region CR. In a process for fabricating a semiconductor process, the wafer W may be cut into multiple individual semiconductor devices 100 that are separated along the scribe region(s) SR. For example, the wafer W may experience a sawing process that is performed along a scribe lane SL of the scribe region SR. In consideration of process error, the scribe region(s) SR may be set to have a width (area) wider than an actual dicing width (area). Thus, after the sawing process, a portion of the scribe region SR may remain on the individual semiconductor device 100. Although not shown in FIG. 12B, the semiconductor device 100 may further include a peripheral region and/or a pad region between the cell region CR and the buffer region BR. The peripheral region and/or pad regions may be variously disposed as needed. In the embodiments that follow, the buffer region BR adjoins the scribe region SR on its one side and the pad region PDR on its opposite side, but the present disclosure is not limited thereto. A description of the semiconductor devices 100 is described hereinafter with the context of the embodiments described above.

Figure 13:
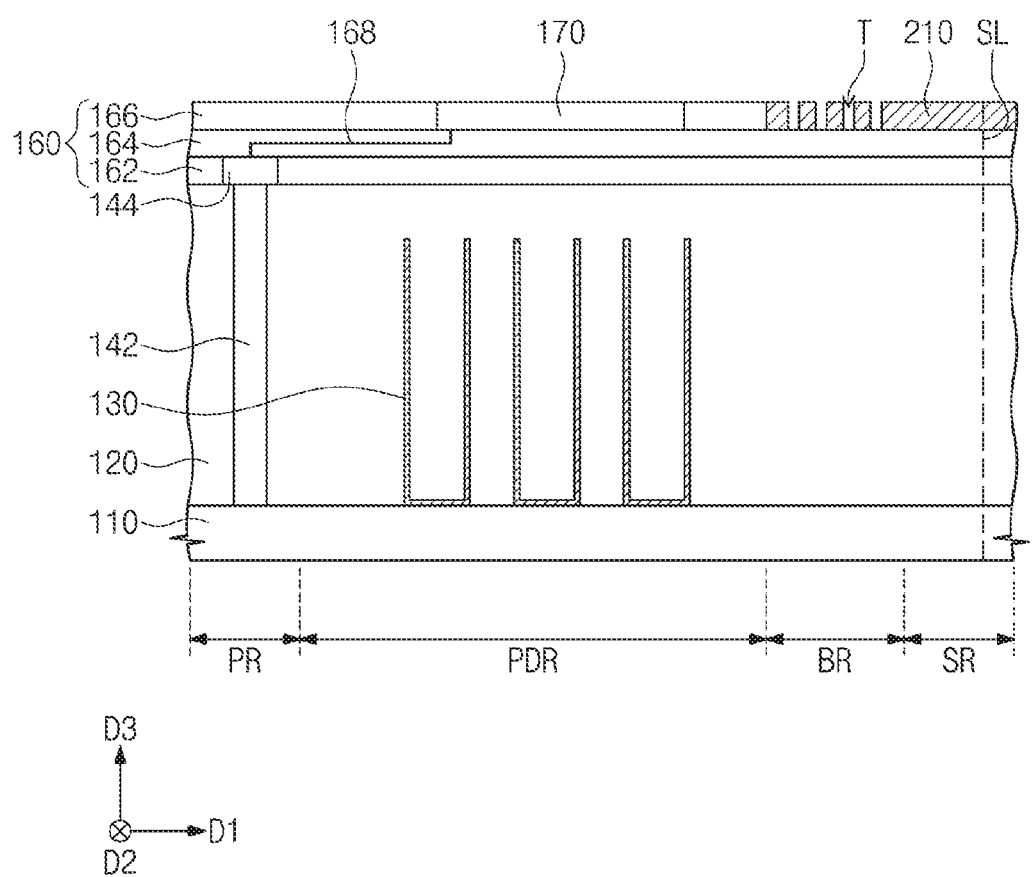
FIG. 13 is a cross-sectional view for explaining a semiconductor device according to exemplary embodiments of the present disclosure.
Figure 14:
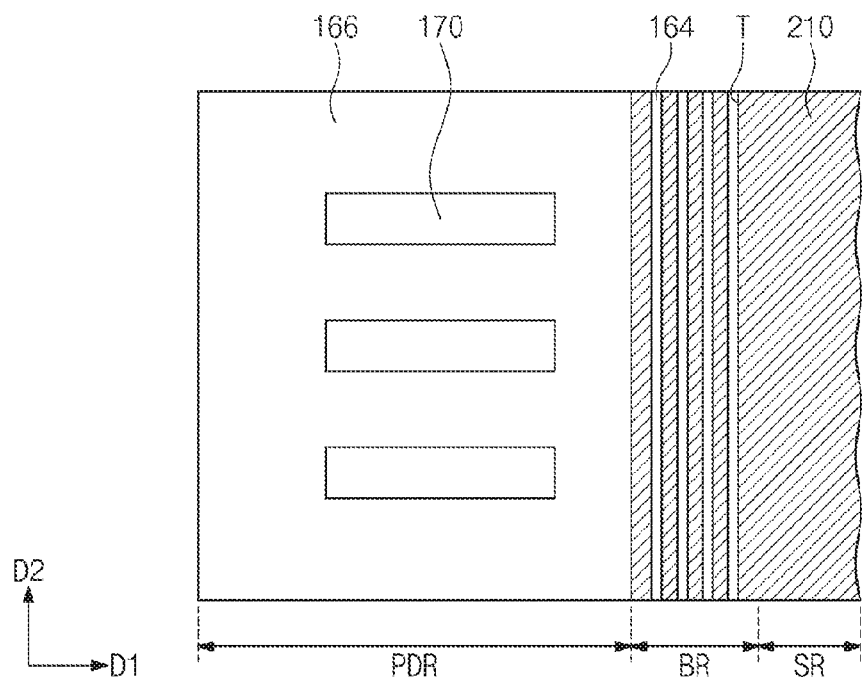
FIGS. 14 and 15 are plan views for explaining a trench shown in FIG. 13.
Figure 15:
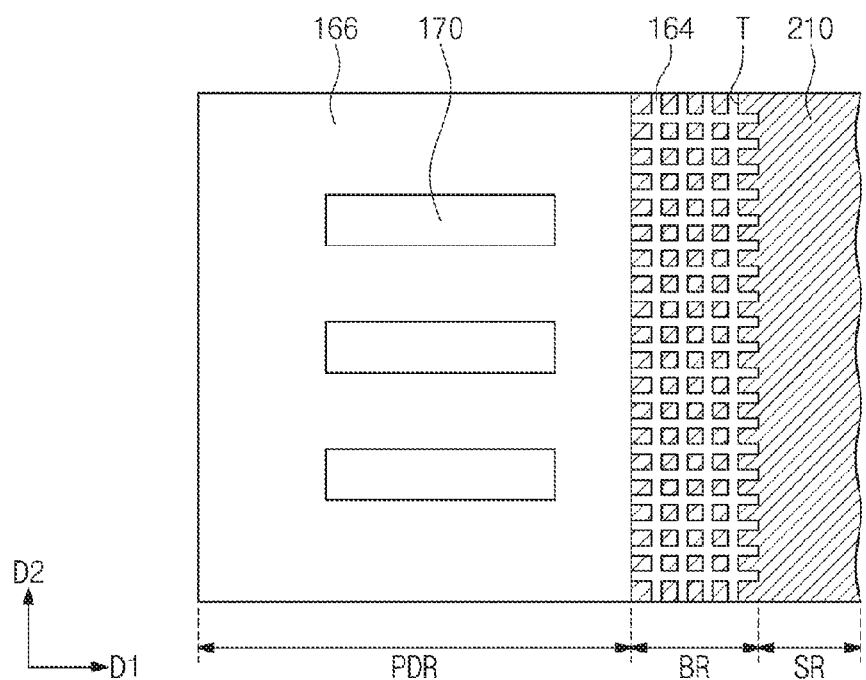
Figure 16:
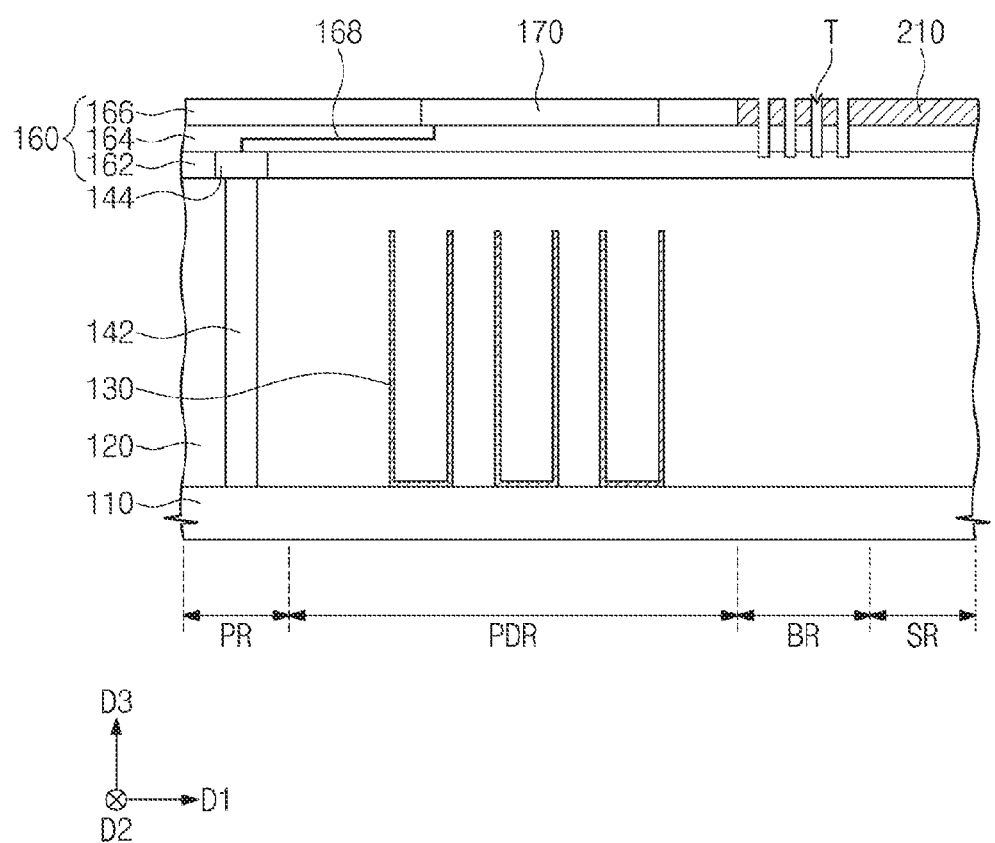
FIG. 16 is a cross-sectional view for explaining a trench shown in FIG. 13.
Figure 17:
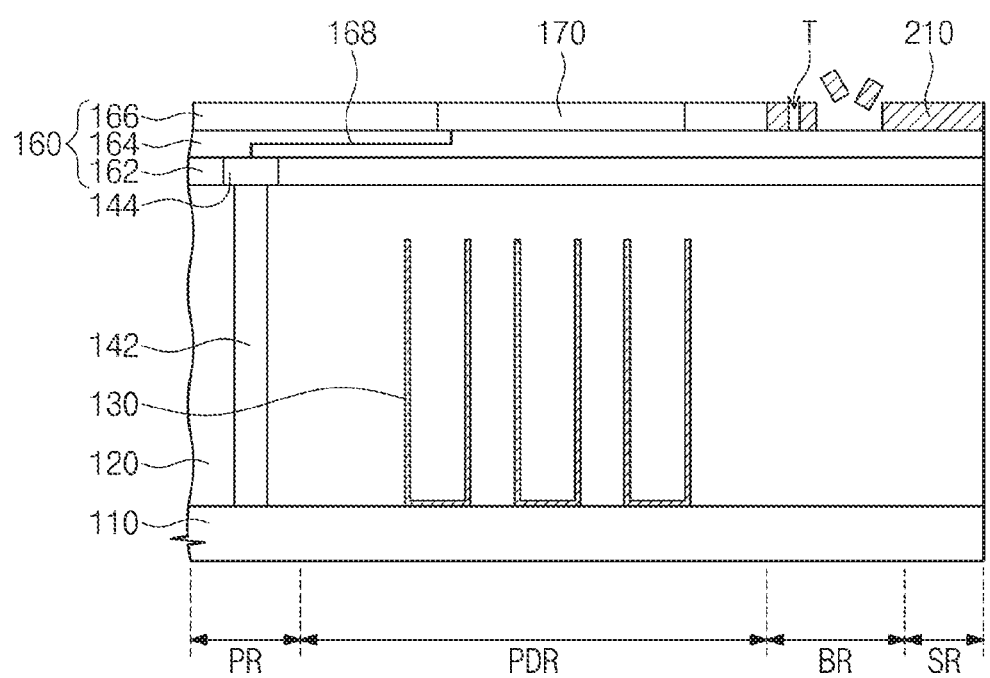
FIG. 17 is a cross-sectional view for explaining cutting of a semiconductor device according to exemplary embodiments of the present disclosure.
Figure 18:
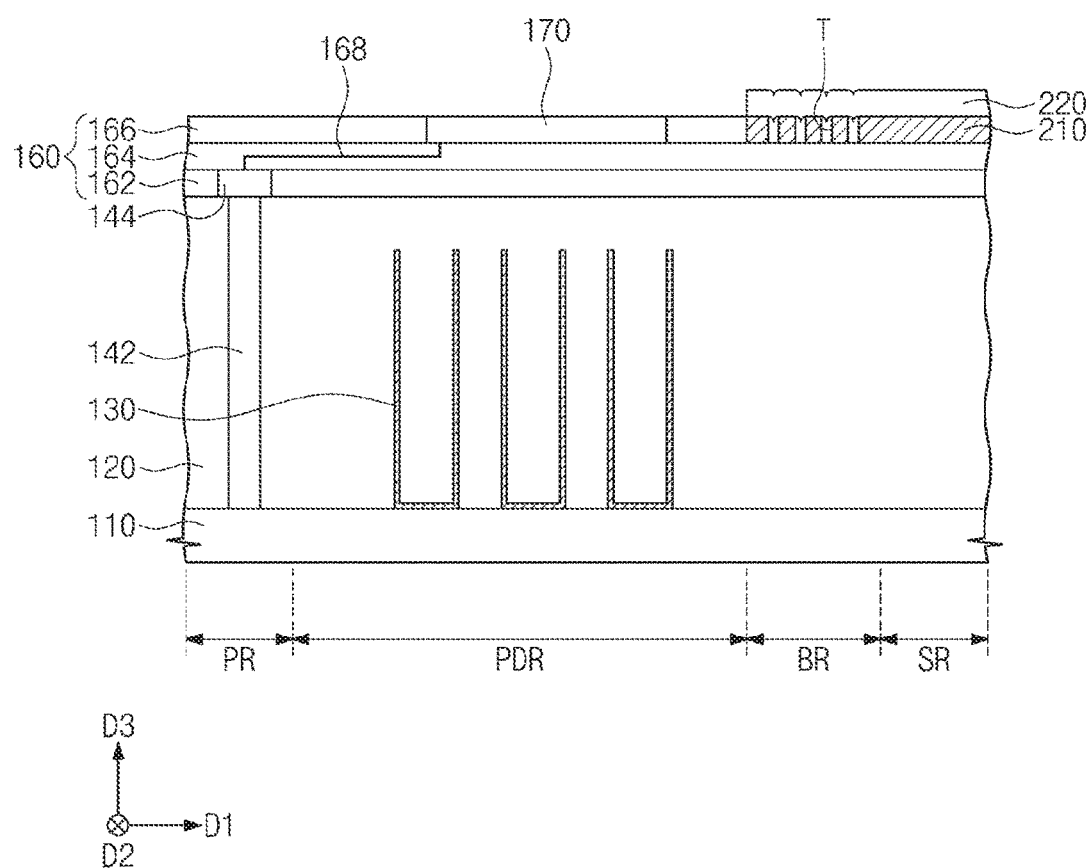
FIGS. 18 and 19 are cross-sectional views for explaining a semiconductor device according to exemplary embodiments of the present disclosure.
Figure 19:
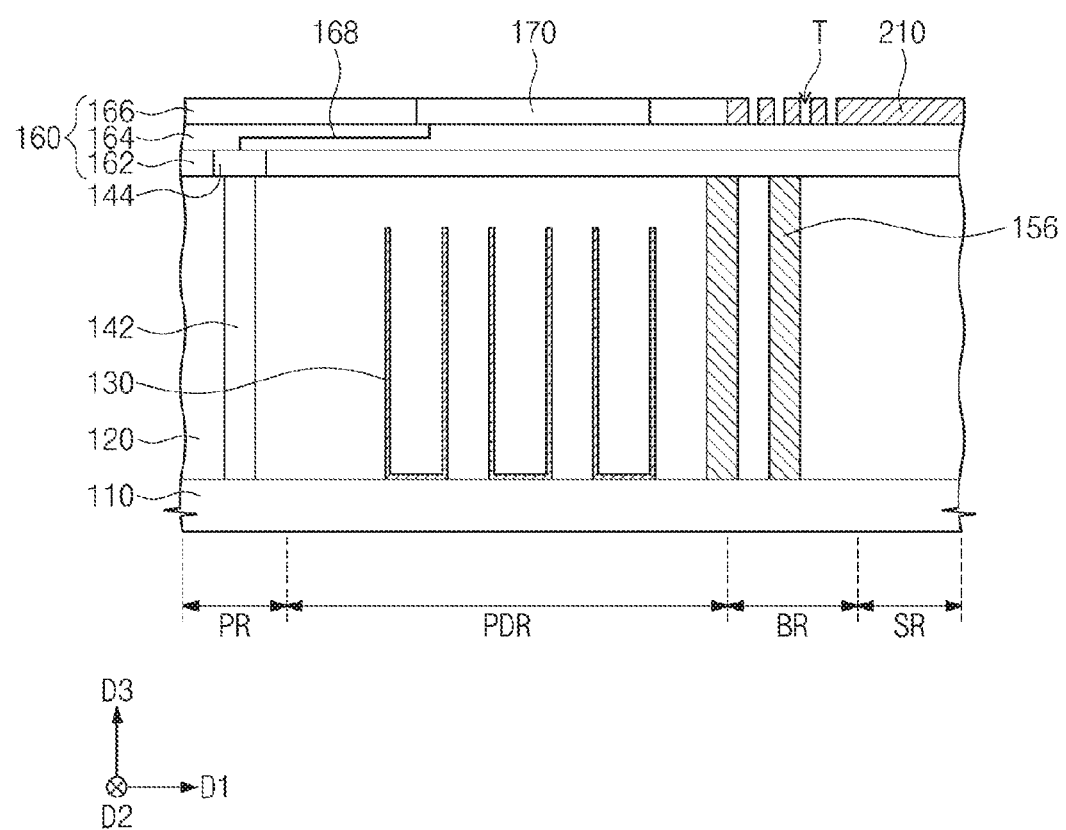

FIG. 13 is a cross-sectional view for explaining a semiconductor device according to exemplary embodiments of the present disclosure. FIGS. 14 and 15 are plan views for explaining a trench shown in FIG. 13. FIG. 16 is a cross-sectional view for explaining a trench shown in FIG. 13. FIG. 17 is a cross-sectional view for explaining cutting of a semiconductor device according to exemplary embodiments of the present disclosure. FIGS. 18 and 19 are cross-sectional views for explaining a semiconductor device according to exemplary embodiments of the present disclosure.

Referring to FIG. 13, the substrate 110 may be provided. For example, the substrate 110 may a semiconductor wafer. Although not shown in figures, a circuit layer (not shown) may be formed on the substrate 110. The circuit layer (not shown) may include the memory circuit, the logic circuit, or a combination thereof. In this description, the circuit layer (not shown) may be disposed on the cell region CR of FIG. 12, and may correspond to the chips.

The first insulation layer 120 may be provided on the substrate 110. The first insulation layer 120 may include the peripheral region PR, the pad region PDR, and the scribe region SR. The pad region PDR may be disposed adjacent to the peripheral and scribe regions PR and SR. The buffer region BR may be disposed between the scribe region SR and the pad region PDR.

The data storage elements 130 may be disposed in the pad region PDR of the first insulation layer 120. The data storage elements 130 may each be a capacitor. Differently from those shown in figures, the data storage elements 130 are not necessarily required for the purposes of the present disclosure, and may be omitted or replaced.

The contact plug 142 may be disposed in the peripheral region PR of the first insulation layer 120. The contact plug 142 may penetrate the first insulation layer 120 in the third direction D3.

The first insulation layer 120 may be provided thereon with the second insulation layer 160, the contact pad 144, and the electrode pad 170. The second insulation layer 160, the contact pad 144, and the electrode pad 170 may be substantially the same as those discussed above.

A metal layer 210 may be provided on the second insulation layer 160. In detail, the metal layer 210 may be disposed in the third layer 166 of the second insulation layer 160. The metal layer 210 may partially or fully cover the buffer region BR and the scribe region SR. The metal layer 210 may have a top surface that is exposed through the third layer 166. Alternatively, the metal layer 210 may extend to be on the pad region PDR, or may not cover the scribe region SR. The metal layer 210 may be insulated from the contact plug 142, the contact pad 144, and the electrode pad 170.

One or more trenches T may be formed in the metal layer 210. The trench T may be disposed on the buffer region BR. The trench T may have a line shape, as viewed in plan. For example, as shown in FIG. 14, the trench T may have a planar shape including multiple lines that extend in the second direction D2. Alternatively, as shown in FIG. 15, the trench T may have a planar mesh shape where multiple lines cross in the first and second directions D1 and D2. The present disclosure is, however, not limited thereto. The trench T may have diverse shapes such as a honeycomb shape.

The trench T may penetrate the metal layer 210 along the third direction D3. The trench T may expose a top surface of the second layer 164 of the second insulation layer 160. Alternatively, as shown in FIG. 16, the trench T may penetrate the metal layer 210 and the second layer 164 of the second insulation layer 160.

The metal layer 210 may protect a semiconductor device from stress. Referring to FIG. 17, the metal layer 210 may prevent cracks caused by stress and/or impact in a process for fabricating a semiconductor device. When the crack propagates into a semiconductor device, circuits of the semiconductor device may be damaged. The scribe region SR may define a region that is cut when a sawing process is performed. The scribe region SR may be cut along the scribe lane (see SL of FIG. 13) set thereon using a blade sawing or a laser sawing method. As easy breakage is likely to occur at a portion of the metal layer 210 including the line or mesh typed trench T, the metal layer 210 may adsorb stress and/or impact applied when a sawing process is performed. In other words, the stress and/or impact may be consumed to break the metal layer 210, and thus the occurrence of cracks may be prohibited. Moreover, the trench T of the metal layer 210 may provide a propagation path of cracks that occurs due to stress, so that the cracks may be prevented from propagating into a semiconductor device.

In some embodiments, a spacer 220 may be further provided. Referring to FIG. 18, the spacer 220 may cover the metal layer 210 on the buffer region BR. The spacer 220 may partially fill the trench T. When stress is applied to a semiconductor device, the spacer 220 may concentrate the stress onto the trench T. The metal layer 210 may therefore be more easily fractured. As a result, stress may be easily absorbed due to the breakage of the metal layer 210.

Referring to FIG. 19, a third dummy dam 156 may be further provided. In this configuration, the third dummy dam 156 may be a component the same as the first dummy dam 152. The metal layer 210 may also be applicable to the embodiment discussed with reference to FIG. 1. For example, the third dummy dam 156 may be disposed in the pad region PDR or the buffer region BR of the first insulation layer 120, and may penetrate the first insulation layer 120 in the third direction D3. The third dummy dam 156 may be disposed adjacent to the scribe region SR. Alternatively, the third dummy dam 156 may be disposed between the contact plug 142 and the data storage elements 130. The third dummy dam 156 may include the same material as the contact plug 142. The third dummy dam 156 may include tungsten (W). For example, the third dummy dam 156 may be formed simultaneously with the contact plug 142 in a process for fabricating a semiconductor device. The third dummy dam 156 may be provided to protect a semiconductor device from stress. The third dummy dam 156 may be tough against stress applied principally in a direction parallel to the top surface of the substrate 110. As noted previously, the word "tough" as used herein means that the protection offered by the third dummy dam 156 protects data storage elements 130 from stress and/or impact that would otherwise be conveyed to the data storage elements 130. For example, the third dummy dam 156 may block stress applied from the scribe region SR toward the pad region PDR when a sawing process is performed. Alternatively, the third dummy dam 156 may be a component different from the first dummy dam 152.

Figure 20:
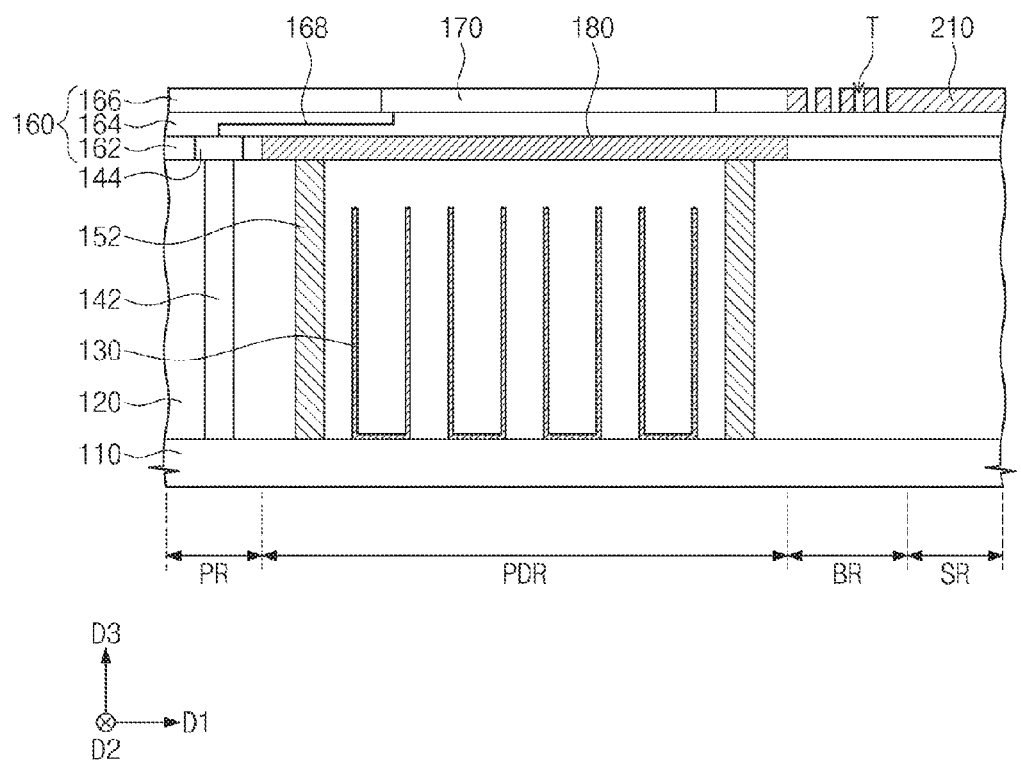
FIG. 20 is a cross-sectional view for explaining a semiconductor device according to exemplary embodiments of the present disclosure.

FIG. 20 is a cross-sectional view for explaining a semiconductor device according to exemplary embodiments of the present disclosure. For convenience of the description, components discussed above are allocated the same reference numerals thereto, and a repetitive explanation is omitted.

Referring to FIG. 20, the substrate 110 may be provided. Although not shown in figures, a circuit layer (not shown) may be formed on the substrate 110.

The first insulation layer 120 may be provided on the substrate 110. The first insulation layer 120 may include the peripheral region PR, the pad region PDR, and the scribe region SR. The pad region PDR may be disposed adjacent to the peripheral and scribe regions PR and SR. The buffer region BR may be disposed between the scribe region SR and the pad region PDR.

A semiconductor device may include the data storage elements 130, the contact plug 142, the contact pad 144, the first dummy dam 152, the second insulation layer 160, the electrode pad 170, and the protection layer 180, which are substantially the same as those discussed with reference to FIG. 9.

The second insulation layer 160 may be provided thereon with the metal layer 210 that covers the buffer region BR and the scribe region SR.

The metal layer 210 on the buffer region BR may be provided therein with the trench T that penetrates the metal layer 210 along the third direction D3. The trench T may have a line or mesh shape, as viewed in plan. The metal layer 210 may be provided to protect a semiconductor device from stress.

The semiconductor device according to exemplary embodiments may include the first dummy dam 152, the protection layer 180, and the metal layer 210, and may thus be tough against externally applied impact or stress.

According to exemplary embodiments of the present disclosure, the semiconductor device may include the first dummy dam 152 that surrounds and protects the data storage elements 130.

As the semiconductor device includes the metal layer that is positioned at the topmost level and has therein the trench, the metal layer may be fractured to absorb stress and impact applied to the semiconductor device when a sawing process is performed, with the result that the occurrence of cracks may be prohibited. Moreover, the trench of the metal layer may provide a propagation path of cracks that occur due to stress, so that the cracks may be prevented from propagating into the semiconductor device.

Although the present invention has been described in connection with the embodiments of the present disclosure illustrated in the accompanying drawings, it is not limited thereto. It will be apparent to those skilled in the art that various substitution, modifications, and changes may be thereto without departing from the scope and spirit of the disclosure.

What is claimed is:

1. A semiconductor device, comprising:
a substrate;
a first insulation layer that is disposed on the substrate and includes a pad region and a peripheral region adjacent to the pad region;
data storage elements in the pad region of the first insulation layer;
a contact plug that penetrates the first insulation layer in the peripheral region; and
a first dummy dam that penetrates the first insulation layer and is disposed between the data storage elements and the contact plug.

2. The semiconductor device of claim 1, wherein the first dummy dam surrounds the data storage elements, in plan view.

3. The semiconductor device of claim 1, wherein the first dummy dam and the contact plug comprise the same material.

4. The semiconductor device of claim 1, further comprising:
a second dummy dam that penetrates the first insulation layer and is disposed between the data storage elements.

5. The semiconductor device of claim 1, further comprising:
a protection layer on the first insulation layer and overlapping the data storage elements,
wherein the protection layer is in contact with the first dummy dam.

6. The semiconductor device of claim 5, further comprising:
a contact pad on the peripheral region of the first insulation layer and in contact with the contact plug,
wherein the protection layer and the contact pad are positioned at the same level.

7. The semiconductor device of claim 6,
wherein the protection layer and the contact pad comprise the same material.

8. The semiconductor device of claim 5,
wherein the protection layer has a line or mesh shape, in plan view.

9. The semiconductor device of claim 1, further comprising:
a second insulation layer on the first insulation layer; and
an electrode pad on the second insulation layer and electrically connected to the contact plug,
wherein the electrode pad overlaps the data storage elements.

10. A semiconductor device, comprising:
a substrate;
a first insulation layer on the substrate, the first insulation layer including a pad region, a scribe region, and a buffer region between the pad region and the scribe region;
a second insulation layer on the first insulation layer; and
a metal layer on the second insulation layer on the buffer region,
wherein the metal layer includes at least one trench.

11. The semiconductor device of claim 10,
wherein the trench has a line or mesh shape, in plan view.

12. The semiconductor device of claim 10,
wherein the trench extends into the second insulation layer.

13. The semiconductor device of claim 10, further comprising:
a spacer on the buffer region and covering the metal layer,
wherein the spacer partially fills the trench.

14. The semiconductor device of claim 10, further comprising:
a dummy dam that vertically penetrates the first insulation layer,
wherein the dummy dam is disposed in the pad region or the buffer region.

15. The semiconductor device of claim 14, further comprising:
- a protection layer on the first insulation layer,
- wherein the protection layer is supported by the dummy dam while being in contact with a top surface of the dummy dam.

16. A semiconductor device, comprising:
- a substrate;
- a first insulation layer on the substrate and including a pad region interior to a peripheral region;
- a plurality of data storage elements at least partly in the pad region of the first insulation layer;
- a contact plug at least partly in the first insulation layer in the peripheral region; and
- a first dummy dam at least partly in the first insulation layer and disposed substantially around the data storage elements so as to form a perimeter around the data storage elements to absorb energy from external impacts to a side of the semiconductor device.

17. The semiconductor device of claim 16,
- wherein the first dummy dam comprises multiple individual components that form a broken perimeter around the data storage elements.

18. The semiconductor device of claim 17, further comprising:
- a second dummy dam at least partly in the first insulation layer and disposed substantially between the data storage elements to absorb energy from stress imposed on the semiconductor device.

19. The semiconductor device of claim 18, further comprising:
- a protection layer on the first insulation layer and overlapping the data storage elements.

20. The semiconductor device of claim 19,
- wherein the protection layer forms a metallic grid to absorb energy from external impacts above the semiconductor device.

* * * * *